Oct. 11, 1955 G. J. KENNEDY 2,720,117

DRIVE SYSTEM FOR TUNING APPARATUS

Filed Dec. 13, 1954 3 Sheets-Sheet 1

INVENTOR.
GILBERT J. KENNEDY
BY
Carl H. Synnestvedt
AGENT

Oct. 11, 1955 G. J. KENNEDY 2,720,117

DRIVE SYSTEM FOR TUNING APPARATUS

Filed Dec. 13, 1954 3 Sheets-Sheet 2

INVENTOR.
GILBERT J. KENNEDY
BY Carl H. Synnestvedt
AGENT

INVENTOR.
GILBERT J. KENNEDY
BY Carl H. Synnestvedt
AGENT

United States Patent Office 2,720,117

Patented Oct. 11, 1955

2,720,117

DRIVE SYSTEM FOR TUNING APPARATUS

Gilbert J. Kennedy, Philadelphia, Pa., assignor to Philco Corporation, Philadelphia, Pa., a corporation of Pennsylvania Application December 13, 1954, Serial No. 474,654

17 Claims. (Cl. 74—10.7)

The present invention relates to mechanical drive systems, and more particularly to mechanisms adapted to provide a differential speed drive.

Although the invention is adaptable for use with various devices, it is especially useful when employed to drive the tuning shaft of television tuners or the like.

Recently, a so-called UHF (ultra high frequency) band has been allocated to commercial television. This UHF band is in addition to the earlier established so-called VHF (very high frequency) band. Because of the availability of these two distinctive television bands, manufacturers of television receivers have been confronted with problems of providing convenient arrangements whereby receivers having VHF tuning systems may be readily and quickly converted to receive any television station within either the UHF or VHF television band. Also, the desirability of providing a UHF tuner adapted to be incorporated in a VHF receiver and to cooperate with the VHF tuner of such a receiver so as to permit reception of both television bands, has given rise to difficulties especially with respect to the mounting and drive connection of the UHF tuner.

For simplicity of construction and ease of operation, it is preferable that the tuners be of the type which accomplish tuning by rotational movement of control means in either direction. It is also desirable that the UHF and VHF tuners be associated together in such a manner that the same manually operable means serves to control the operation and setting of both tuners. The use of the same manually operable means for associated UHF and VHF tuners of the above mentioned type brings about complications, particularly when attempts are made to provide for coarse and fine tuning throughout the tuning range in either direction for both bands.

Accordingly, it is an object of the present invention to overcome the above mentioned difficulties and complications by providing an arrangement in which coarse and fine tuning is effected through operation of a novel differential drive system associated with manually operable means disposed at one location on the receiver cabinet.

It is also the object of the present invention to provide an improved mounting arrangement and novel drive system for the tuning means of a television receiver whereby the receiver may be readily and quickly adapted for tuning to any channel within all available television bands.

A characteristic feature of the invention resides in the provision of a simplified association of elements which does not require dismantling of a television receiver when it is desired to incorporate means adapted to extend the range of television frequencies over which the receiver may be utilized.

The invention is further characterized by the provision of a novel drive system for the tuning means of a UHF-VHF television receiver, which system makes it possible to obtain any desired suitable ratio between the rotation of the manually operable element and the rotation of the actuating shaft of the tuner so as to provide for coarse and fine tuning as well as to compensate for the substantial difference between the number of channels in one frequency band and the number of channels in the other frequency band.

Briefly stated, the above noted objects and features of the invention are achieved by utilizing a novel drive system which operates on the planetary principle but which does not employ sun and planet gears. In particular accordance with the invention, a planetary-like drive device is obtained with the use of a simple drive cord arrangement which is capable of being made an integral part of a tuner to form a conveniently handled unitary structure. According to a specific embodiment of the invention, the drive cord arrangement is associated with the manually rotatable element of the control means and with the rotational actuating shaft of the tuner means in such a manner as to cause said element and shaft to rotate at the same ratio, or at a different predetermined ratio. According to another specific embodiment of the invention, means is associated with the drive device to modify its operation so that the actuating shaft of the tuner means may rotate with the manually rotatable element at the same ratio or at two different predetermined ratios.

In both of the above noted embodiments of the invention the drive cord device and the tuner structure may be assembled prior to installation in a television receiver. In this manner, the pre-assembled drive cord device and tuner structure may be simply installed in the receiver without requiring the installer to perform the extra task of applying drive cord to drive pulleys, drums or like elements.

The invention, its objects, features and advantages will be more fully understood from the following description taken in conjunction with the accompanying drawings in which.

Figure 1:
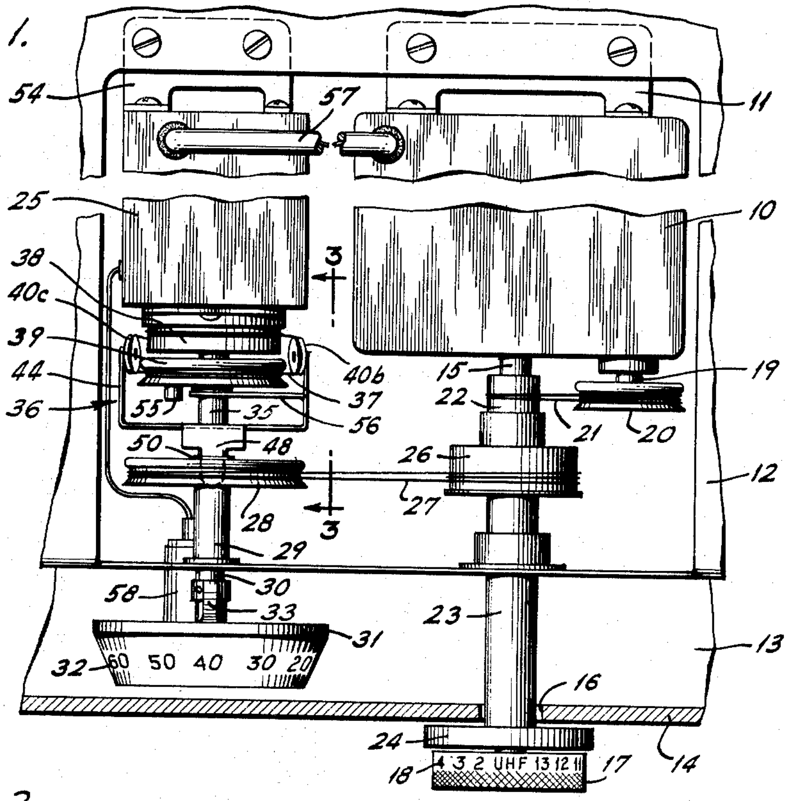
Figure 1 is a top plan view of a portion of a television receiver chassis provided with tuning means arranged in accordance with a preferred embodiment of the present invention.

With more particular reference to the drawings there is illustrated in Figure 1, a VHF tuner 10 mounted as by means of a bracket 11 on a portion of a television receiver chassis 12. This chassis is of usual construction and is enclosed within a cabinet, base and front portions of which are shown at 13 and 14, respectively. The VHF tuner 10 is of conventional design and includes a coarse tuning shaft 15 which extends through an aperture 16 formed in the front portion of the cabinet and which rigidly carries a coarse-tuning knob 17. The shaft 15 and its knob 17 can be rotated continuously in either direction to select a desired VHF station and for that purpose the peripheral surface of the knob is provided with an appropriate channel identifying scale 18. The tuner 10 also includes a fine tuning shaft 19 carrying a pulley 20 in engagement with a cord 21. This cord in turn is wound in frictional engagement with a portion 22 of a sleeve 23 which is rotatably mounted on the coarse tuning shaft 15 and concentrically disposed with respect thereto. The sleeve 23 also extends through the opening 16 and is provided with a fine tuning knob 24.

The VHF tuner 10 is of the well known kind which includes switching means (not shown) to adapt said VHF tuner for cooperation with a UHF tuner 25 so that the receiver may be tuned to telecasting stations within the UHF band, when the coarse-tuning shaft 15 is rotated to the UHF position indicated on the scale 18 of the coarse tuning knob 17. In particular accordance with the invention provision is made whereby the UHF tuner 25 may be conveniently inserted in the receiver and associated with the VHF tuner 10 without the necessity of effecting complicated mechanical and electrical connections.

Figure 3:
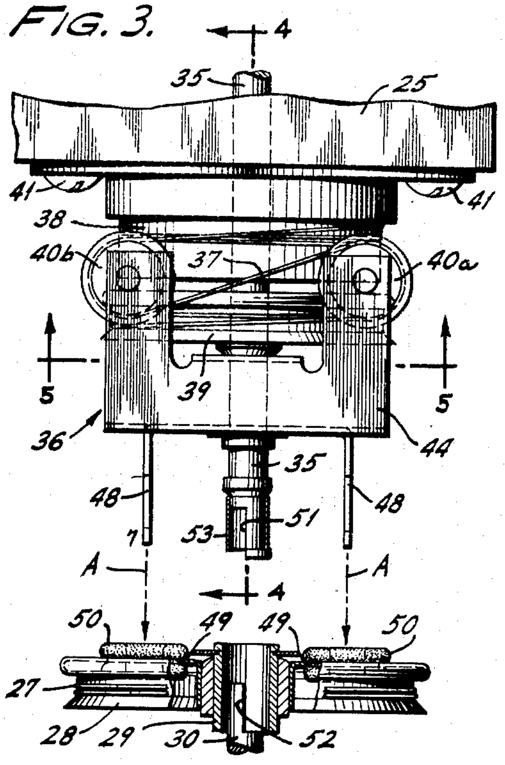
Figure 3 is a side elevational view, on an enlarged scale, looking in the general direction of arrows 3—3 of Figure 1, with certain parts separated from each other to illustrate a characteristic feature of the invention.
Figure 2:
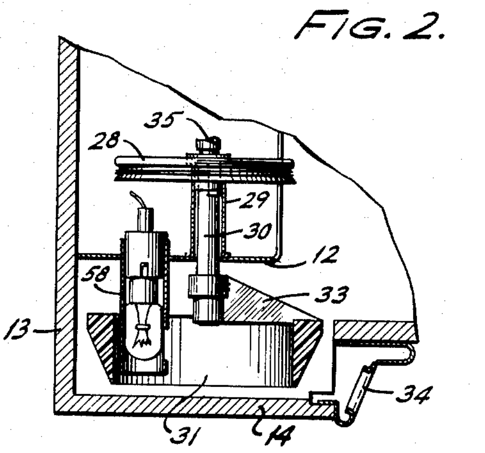
Figure 2 is a fragmentary sectional view of a portion of the arrangement shown in Figure 1.
Figure 4:
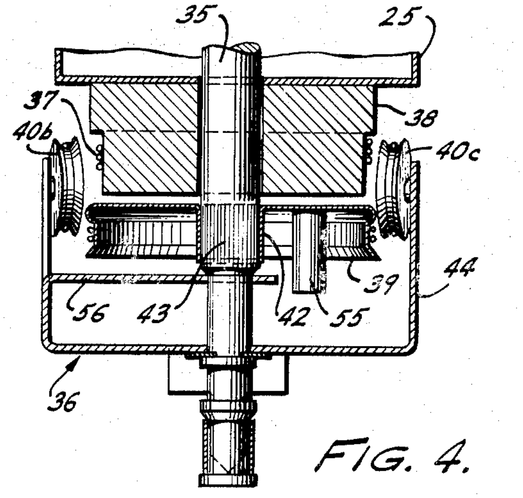
Figure 4 is a sectional view taken substantially along line 4—4 of Figure 3.
Figure 5:
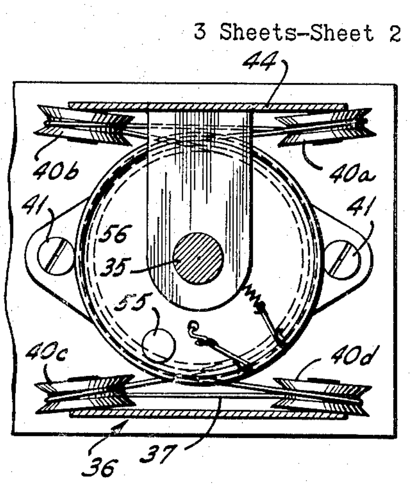
Figure 5 is a sectional view taken substantially along line 5—5 of Figure 3.
Figure 6:
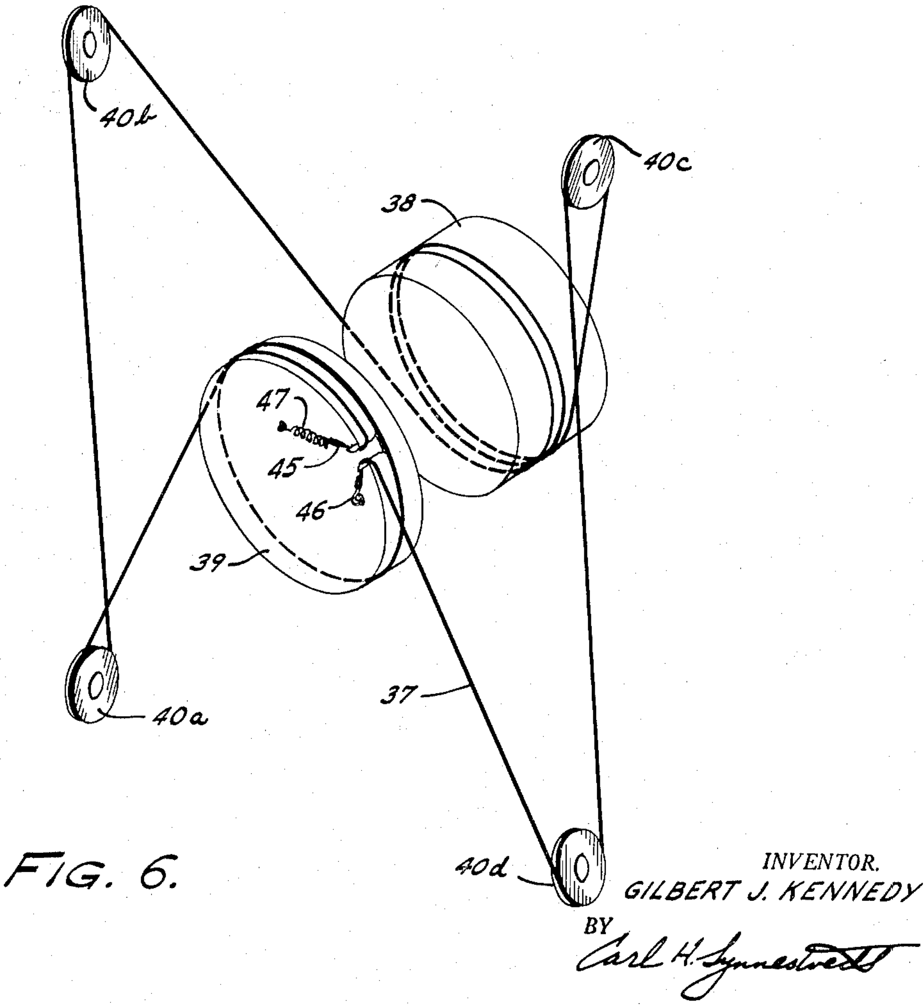
Figure 6 is a schematic view in perspective and illustrates the cord drive arrangement.

As seen in Figure 1, the rotatable sleeve 23 which normally is operable to effect fine tuning of the VHF tuner, is formed with a drum portion 26. A cord 27 is wound about this drum portion and also about a pulley 28 rotatably mounted on a bushing 29 which is affixed to the chassis 12 and provides a support for a stub shaft 30. A dial 31 having a UHF channel scale 32 is suitably anchored to the stub shaft 30 by means of a narrow rib 33. This dial is conveniently enclosed within the cabinet structure and is located immediately in back of the front portion 14 which is provided with a viewing opening 34 (Figure 2) by means of which the scale markings on the dial 31 are displayed as the latter rotates in response to actuation of the knob 24 (Figure 1). The pulley 28 is adapted for detachable engagement with the UHF tuner 25 to impart motion to its rotatable tuning shaft 35 through novel driving means which is in the form of a gearless planetary-like drive arrangement 36 and includes a cord 37, a pair of drum elements 38 and 39 and four guiding pulleys 40*a*, 40*b*, 40*c* and 40*d*. The drum elements 38 and 39 are arranged coaxially with respect to each other and with respect to the tuning shaft 35 of the UHF tuner 25. As best seen in Figure 3, the drum element 38 is stationarily mounted as by means of bolts 41 connecting said element to a fixed portion of said UHF tuner. The other drum element 39 advantageously takes the form of a pulley and is affixed to the tuning shaft 35 for instance, as seen in Figure 4, by press-fitting the pulley central hub 42 onto a serrated portion 43 of said shaft. The guiding pulleys 40*a*, 40*b*, 40*c* and 40*d* are rotatably supported by means of a cage-like structure 44 disposed to revolve freely on the tuning shaft 35 of the UHF tuner so as to move said guiding pulleys in a circular path about the periphery of the mentioned drum elements. The cord 37, as is more clearly seen in schematic Figure 6, is attached at one end 45 to the drum element or driven pulley 39 and is wound a few turns about said pulley. From this pulley the cord 37 passes in engagement with the first guiding pulley 40*a*, then with the second guiding pulley 40*b* and thence is wound a few turns about the fixed drum element 38. From this drum element the cord passes in engagement with the third guiding pulley 40*c*, then with the fourth guiding pulley 40*d*, and thence back to the drum element or driven pulley 39 to which the other end of the cord is anchored as at 46. In order to maintain the cord 37 in taut condition, a spring 47 is conveniently connected to the face of the driven pulley and to the end 45 of said cord.

The above described drive arrangement and the associated UHF tuner form a unitary structure which can be bodily mounted in cooperative relationship with the VHF tuner within the television receiver. This is conveniently accomplished by providing the cage-like structure 44 with a pair of forwardly extending prongs 48 which, as indicated by the arrows A in Figure 3, are disposed for alignment with and introduction into apertures 49 formed through the face of the pulley 28. Snug engagement between the prongs 48 and the pulley 28 is conveniently obtained by lining the apertures 49 with suitable frictional material such as rubber grommets 50. To effect connection between the UHF tuner shaft 35 and the dial-carrying shaft 30, the abutting ends of each of these shafts are formed with interengageable flats 51 and 52 which are maintained in mutual engagement by means of a tubular collar 53 retained on one of said sections and surrounding both sections when brought together.

When engagement between the prongs 48 and the pulley 28 and between the tuning shaft 35 and the dial carrying shaft 30 is effected, and when the UHF tuner is supported on the chassis 12 as by means of a bracket 54, rotation of the knob 24 in either clockwise or counterclockwise direction will impart rotation to the pulley 28 through the cord 27. In turn, the pulley 28 will rotate the cage-like structure 44 and the guiding pulleys thereon about the adjacent drum elements 38 and 39. Rotation of said structure 44 causes the cord 37 to wind off and on one drum element as said cord winds on and off the other drum element. It is to be understood that if both drum elements were of the same diameter the cord would merely travel from one to the other of said drum elements and would have no effect on the rotatable drum element or pulley 39. However, as is shown in the drawings, the drum elements are of different diameters so that displacement of the cord brings about a condition in which a tensile force is developed in the drive cord, this force being transmitted through said cord to the point of tangency with the rotatable drum element 39, and causes the latter to move through an angular distance which is governed by the difference in the diameters, and therefore of the circumferences, of the two drum elements.

In the illustrated embodiment, the diameters of the two drum elements are in such ratio—differing by only a small amount—that the rotatable drum element 39, and therefore the associated UHF tuner shaft 35, are caused to rotate through a small angle as compared with any given angular increment of rotation imparted to the cage-like structure 44. In this way considerable displacement of the knob 24, and therefore of said cage-like structure results in relatively small angular movement of the drum element 39 and the associated shaft 35, thus providing fine tuning.

In order to obtain a coarse tuning condition in which the drum element or driven pulley 39 and its associated tuning shaft 35 are rotated at the same rate as the cage-like structure 44 and its associated knob 24, there are provided interengageable stops 55 and 56 on said pulley and on the cage-like structure, respectively. With this arrangement, when the knob 24 rotates the cage-like structure in one direction and brings the stop 56 into engagement with the stop 55, the selection of a UHF station may be quickly made and, if necessary, fine tuning may then be accomplished by actuating said knob to rotate the cage-like structure in the opposite direction thereby moving the tuning shaft 35 at the slower rate as previously described. It will be understood that when a direct coupling is established between the drum element 39 and the cage-like structure 44, by interengagement of the stops 55 and 56, the cord 37 does not travel between said drum elements but merely slips about the latter.

Electrical connection between the VHF tuner and the UHF tuner to energize the latter when the VHF coarse tuning knob 17 is moved to the UHF position, is conveniently accomplished by means of a suitable conductor cable 57 interconnecting said tuners. In order to facilitate reading of the dial scale 32 through the viewing opening 34 in the cabinet portion 14, an electric bulb device 58 is associated with the UHF tuner in such a manner that the electric bulb illuminates the dial when the UHF tuner is energized.

Figure 7:
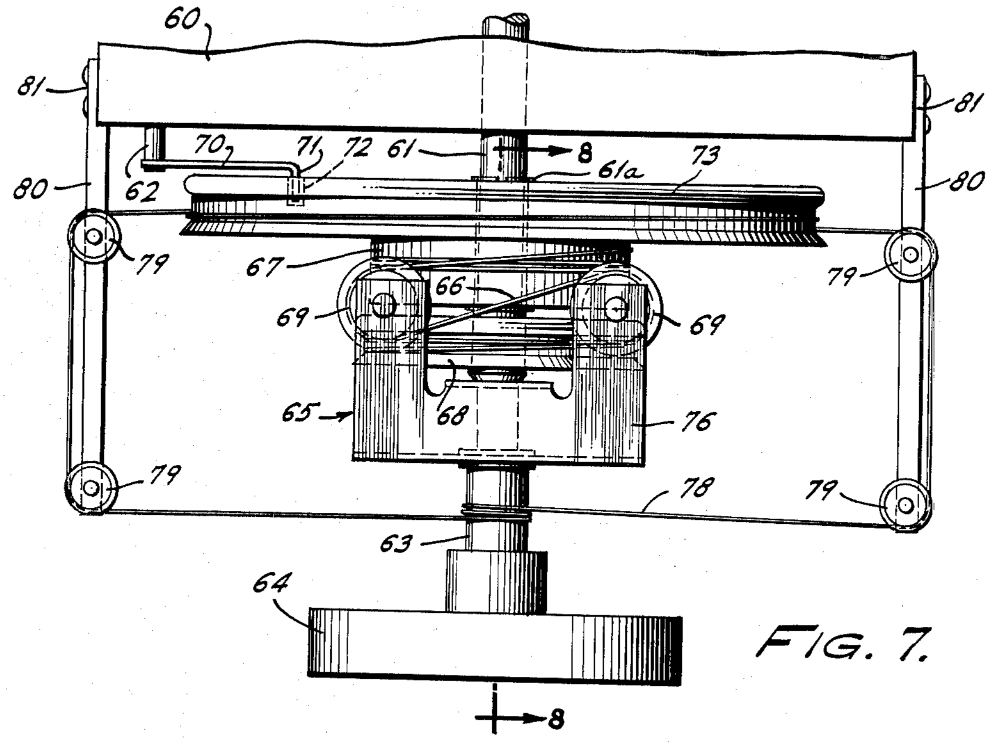
Figure 7 is a side elevational view of a modified embodiment of the invention; and, Figure 8 is a cross-sectional view looking in the general direction of arrows 8—8 of Figure 7.
Figure 8:
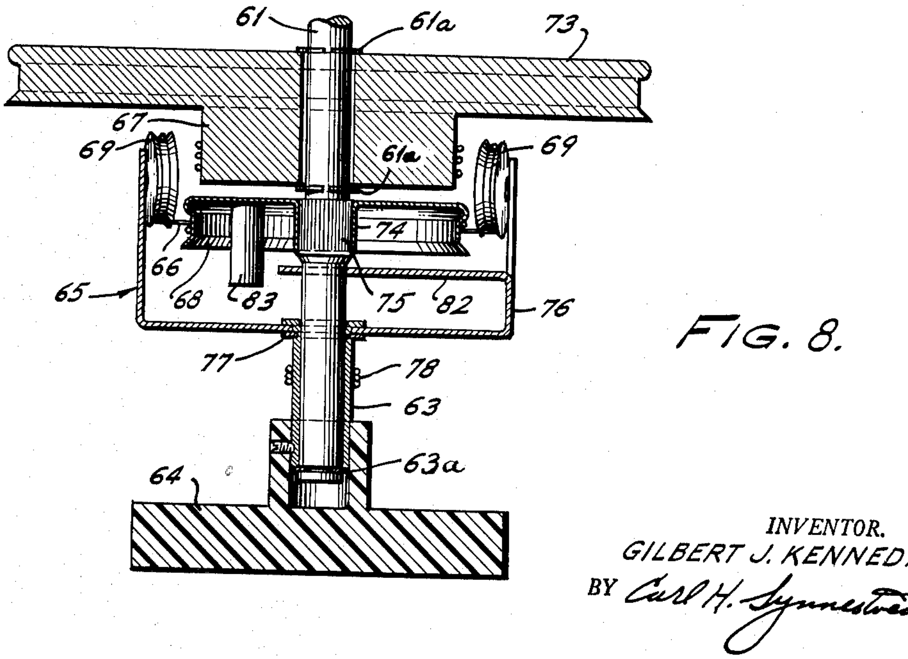

In the embodiment shown in Figures 7 and 8, the drive system constructed in accordance with the invention is associated with a single tuner device 60 which is of conventional design and adapted to tune a television receiver to all channels either in the VHF band or in the UHF band. As seen in Figure 7, the tuner 60 is provided with a tuning shaft 61 and with a band-switch operated shaft 62, both shafts extending outwardly of the housing of said tuner device.

In accordance with the invention, a sleeve 63 fixedly carrying an operating knob 64, is concentrically mounted on the shaft 61 to rotate freely either in clockwise or counter-clockwise direction. The sleeve 63 is retained on said shaft 61 by means of a locking washer 63*a* in engagement with the end portion of the shaft 61, as seen in Figure 8.

A gearless planetary-like drive arrangement 65 which is generally similar to that hereinbefore described, is associated with the shaft 61 and with the sleeve 63. As seen in Figures 7 and 8, this drive arrangement includes a cord 66, drum elements 67 and 68 and guiding pulleys 69. The drum elements 67 and 68 are arranged concentrically with respect to each other and with respect to the tuning shaft 61 and sleeve 63. The drum element 67 is freely mounted on the shaft 61 but is held in position thereon by means of retaining elements or split washers 61*a*. The drum element 67 is normally locked against rotation by means of a latch device 70 provided with a locking finger 71 engaging a keeper portion 72 on an enlarged pulley 73 which is rigid with said drum member. The drum element 68 is affixed to the tuning shaft 61 (see Figure 8) by press-fitting a central hub portion 74 of said element 68 onto a serrated portion 75 of said shaft.

Guiding pulleys 69 are rotatably supported on a cage-like structure 76 affixed to the sleeve 63, as is shown at 77, so as to rotate therewith upon actuation of the operating knob 64. In this manner, the cage-like structure 76 is adapted to revolve on the tuning shaft 61 so as to move the guiding pulleys 69 in a circular path about the periphery of the drum elements 67 and 68. The cord 66 is wound about said drum elements and passes about said guiding pulleys in the same manner as was hereinbefore described with reference to the schematic Figure 6.

As seen in Figure 7, a second cord 78 is wound a few turns about a portion of the sleeve 63 and about the periphery of the enlarged pulley 73. This second cord is guided from said sleeve to said pulley by means of guiding idlers 79 rotatably carried on supports 80 which are conveniently mounted on the housing of the tuner 60, as is shown at 81.

With the arrangement shown in Figures 7 and 8, it will be understood that when the latch 70 locks the pulley 73 to hold the drum 67 against rotation, the operation of said arrangement is the same as that of the arrangement previously described with reference to Figures 1, 3, 4 and 5. This is because rotation of the knob 64 imparts rotation to the cage-like structure 76 through the sleeve 63 and because the cord 66 causes the pulley 68 and tuning shaft 61 to rotate due to the difference between the diameter of the drum element 68 and the diameter of the drum element 67.

Also, for the reasons hereinbefore explained, the tuning shaft 61 is rotated at a rate slower than the cage-like structure 76 and its operating knob 64, thus providing fine tuning. During fine tuning, the cord 78 slips about the sleeve 63, since as above stated, the latch device 70 prevents the pulley 73 and the drum element 67 from being driven by said cord 78.

When the band switch operated latch device 70 is actuated to release the pulley 73, there is produced a condition which results in a further difference in the rate of rotational speed between the cage-like structure 76 and the drum element 68. This is due to the fact that the pulley 73 and the drum element 67 are then driven by the sleeve 63 through the cord 78. In the arrangement, as shown in Figure 7, the cord 78 so engages the sleeve 63 and enlarged pulley 73 that rotation of the knob 64 in one direction causes said pulley and associated drum element 67 to rotate in the opposite direction. Thus, it will be seen that the rate at which the cord 66 moves between the drum elements 67 and 68 is reduced with the result that rotation of the tuning shaft 61 is slower than when the latch 70 prevents the rotation of said pulley 73 and its associated drum element 67.

Coarse tuning is obtained by means of a stop 82 disposed on the cage-like structure 76 to engage a stop 83 disposed on the driven drum element 68. By turning the knob 64 in either direction so as to bring the stop 82 in contact with the stop 83, the entire drive system can be rotated as a unit so that the selection of a station can be quickly made and, if necessary, fine tuning may then be accomplished by rotating the knob in the opposite direction thereby bringing the cord drive means into play so as to rotate the tuning shaft 61 at the slower rate.

It will be understood that, if desired, the cord 78 may engage pulley 73 and the sleeve 63 in such a manner that said pulley and its associated drum element 67 will rotate in the same direction as the knob 64. In that case, the rate at which the cord 66 moves between the drum elements 67 and 68 is increased so that the tuning shaft 61 will rotate faster than when the latch 70 engages the pulley 73 and holds the drum element 67 against rotation. This latter result will also be obtained by utilizing the cord arrangement as shown, but by changing the size of the pulley 73 so as to cause the tuner shaft 61 to rotate in a direction opposite to the direction of rotation of the knob 64.

From the foregoing description, it will be appreciated that the invention makes it possible to provide simple cord drive arrangements whereby coarse and fine tuning of stations within either the VHF or the UHF band are obtained by means of a simple manual control device. Particularly, the fact that the differential drive apparatus of the invention can be constructed so as to form a unit with a tuning device has the advantage of providing a tuning control structure which can be readily handled and easily mounted in operative position.

I claim:

1. In combination with a member adapted to be rotatably driven, a differential drive system comprising a pair of coaxial drum elements of different diameters, one of said drum elements being connected with said member to drive the same, the other of said drum elements being held against rotation, a cord arranged in wrapped engagement with both drum elements and having portions extended between said drum elements, a rotatable structure including guide means engaging said portions of said cord, and driving means for rotating said structure to displace said guide means in a circular path about said drum elements whereby to lap up and take off cord with respect to said drum elements, the difference in the diameters of said drum elements causing said cord to impart rotation to said one of said drum elements, and being such that said one of said drum elements rotates at a rate slower than the rate at which said structure is rotated by said driving means.

2. The combination set forth in claim 1, in which the mentioned pair of coaxial drum elements are also disposed coaxially with respect to the member to be driven, and the mentioned one of said drum elements is affixed to said member.

3. The combination set forth in claim 1, in which the mentioned one of said drum elements has a diameter larger than the diameter of the other of said drum elements.

4. The combination set forth in claim 1, in which the mentioned pair of coaxial drum elements are also disposed coaxially with respect to the member to be driven, and in which the mentioned one of said drum elements is affixed to said member and has a diameter larger than the diameter of the other of said drum elements.

5. The combination set forth in claim 1, in which the additional means is provided to interconnect the mentioned one of said drum elements and the mentioned rotatable structure to cause said one of said elements to rotate at the same rate as said structure.

6. The combination set forth in claim 5, in which the mentioned additional means includes two interengageable stops, one of said stops being carried by the mentioned one of said drum elements, and the other of said stops being carried by the mentioned rotatable structure.

7. The combination set forth in claim 1, in which the mentioned pair of coaxial drum elements are also disposed coaxially with respect to the member to be driven, the mentioned one of said drum elements being affixed to said member, said one of said drum elements having a diameter larger than the diameter of the other of said drum elements and, under one condition of operation, rotating at a rate slower than the rate at which said structure is rotated, and means interconnecting said one of said drum elements and said rotatable structure to cause said one of said elements, under another condition of operation, to rotate at the same rate as said structure.

8. In combination with a member adapted to be rotatably driven, a differential drive system comprising a pair of coaxial drum elements of different diameters, one of said drum elements being connected with said member, the other of said drum elements being rotatably mounted with respect to said one of said drum elements, locking means for restraining said other of said other drum elements against rotation, a cord arranged in wrapped engagement with both of said drum elements and having portions extended between said drum elements, a rotatably supported structure including guide means engaging said portions of said cord, driving means for rotating said structure to displace said guide means in a circular path about said drum elements whereby to lay up and take off cord with respect to said drum elements, the difference in the diameters of said drum elements causing said cord to impart rotation to said one of said drum elements, and being such that said one of said drum elements rotates at a rate slower than the rate at which said structure is rotated by said driving means, means connecting said driving means to the other of said drum elements, and means for releasing said locking means to free said other of said drum elements for rotation through said driving means to modify the rate at which said one of said drum elements rotates with respect to the rate at which said structure is rotated.

9. The combination set forth in claim 8, in which the mentioned means connecting the driving means to the other of said drum elements includes a set of idlers and a cord in riding engagement with said idlers and in frictional engagement with said driving means and said other of said drum elements.

10. The combination set forth in claim 8, in which the mentioned one of said drum elements has a diameter larger than the diameter of the other of said drum elements.

11. The combination set forth in claim 8, in which means is provided to interconnect the mentioned one of said drum elements and the mentioned rotatable structure to cause said one of said elements to rotate at the same rate as said structure.

12. The combination set forth in claim 8, in which the mentioned pair of coaxial drum elements are also disposed coaxially with respect to the member to be driven, and in which the mentioned one of said drum elements is affixed onto said member, the other of said drum elements is rotatably mounted on said member, and the mentioned rotatable structure is rotatably supported on said member.

13. The combination set forth in claim 8, in which the mentioned pair of coaxial drum elements are also disposed coaxially with respect to the member to be driven, and in which the mentioned one of said drum elements is affixed onto said member, the other of said drum elements is rotatably mounted on said member, the mentioned rotatable structure is rotatably supported on said member, said one of said elements having a diameter larger than the diameter of the other of said drum elements and, under one condition of operation, rotating at a rate slower than the rate at which said structure is rotated, and means for interconnecting said one of said drum elements and said rotatable structure to cause said one of said elements, under another condition of operation, to rotate at the same rate at which said structure is rotated.

14. In combination, a television receiver provided with a VHF tuner having manually operable tuning means and a cord-and-pulley drive arrangement connected with said means, a UHF tuner adapted for demountable insertion in the receiver to cooperate with said VHF tuner, said UHF tuner comprising a rotatable tuning shaft, a first drum element of predetermined diameter disposed coaxially with respect to said shaft and connected thereto to rotate the same, a second drum element of a different predetermined diameter disposed concentrically with respect to said shaft and to said first drum element, means for preventing rotation of said second drum element, a cord arranged in frictional engagement with said first and second drum elements and having portions extended therebetween, a cage-like structure rotatably supported on said shaft, said structure having means for detachable connection to the pulley of said cord-and-pulley drive arrangement, said structure further having means engaging said portions of said cord and displaceable in a circular path about said first and second drum elements to move said cord whereby to lay up and take off cord with respect to said drum elements, the difference in the diameters of said drum elements causing said cord to impart rotation to said first drum element, and being such that, under one condition of operation, said first drum element rotates at a rate slower than the rate at which said structure is rotated through said drive arrangement in response to operation of said manually operable tuning means, and means for interconnecting said first drum element and said cage-like structure to cause said element, under another condition of operation, to rotate at the same rate as said structure.

15. The combination set forth in claim 14, in which a television station indicating dial is connected with the tuning shaft of the mentioned UHF tuner to rotate in unison with said shaft.

16. In combination, an electrical frequency tuning device having a rotatable tuning shaft, a first drum element of predetermined diameter disposed coaxially with respect to said shaft, said first drum element being mounted on said shaft and affixed thereto to rotate the same, a second drum element of a different predetermined diameter disposed concentrically with respect to said shaft and to said first drum element and rotatably mounted on said shaft, locking means for restraining said second drum element from rotation on said shaft, a cord arranged in frictional engagement with said first and second drum elements and having portions extended between both of said drum elements, a cage-like structure rotatably supported on said shaft, manually operable driving means rotatably carried by said shaft and connected to said structure to rotate the same, said structure having means engaging said portions of said cord and displaceable in a circular path about said first and second drum elements whereby to lay up and take off cord with respect to said drum elements, the difference in the diameters of said drum elements causing said cord to impart rotation to said first drum element, and being such that said first drum element is rotated at a rate slower than the rate at which said structure is rotated by said driving means, means connecting said driving means to said second drum element, means for releasing said locking means to free said second drum element for rotation through said driving means to modify the rate at which said first drum element is rotated with respect to the rate at which said structure is rotated by said driving means, and means for interconnecting said first drum element and said structure to provide for rotation of said first drum element at the same rate as said structure.

17. The combination set forth in claim 16, in which the tuning device is provided with a band-switch operated shaft and the mentioned locking means is connected to said shaft and actuated in response to operation of the latter.

No references cited.